(12) United States Patent
Sargsyan et al.

(10) Patent No.: US 10,529,436 B1
(45) Date of Patent: Jan. 7, 2020

(54) ONE-TIME PROGRAMMABLE BITCELL WITH DIODE UNDER ANTI-FUSE

(71) Applicant: Synopsys, Inc., Mountain View, CA (US)

(72) Inventors: Hrant Sargsyan, Yerevan (AM); Andrew E. Horch, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/872,673

(22) Filed: Jan. 16, 2018

Related U.S. Application Data

(60) Provisional application No. 62/447,201, filed on Jan. 17, 2017.

(51) Int. Cl.
| | | |
|---|---|---|
| *G11C 17/16* | (2006.01) | |
| *H01L 27/112* | (2006.01) | |
| *H01L 23/525* | (2006.01) | |
| *H01L 29/06* | (2006.01) | |
| *H01L 29/45* | (2006.01) | |
| *G11C 17/18* | (2006.01) | |
| *H01L 29/861* | (2006.01) | |

(52) U.S. Cl.
CPC ............ *G11C 17/165* (2013.01); *G11C 17/18* (2013.01); *H01L 23/5252* (2013.01); *H01L 27/11206* (2013.01); *H01L 29/0649* (2013.01); *H01L 29/0684* (2013.01); *H01L 29/45* (2013.01); *H01L 29/861* (2013.01)

(58) Field of Classification Search
CPC ........ G11C 17/16; G11C 17/165; G11C 17/18
See application file for complete search history.

(56) References Cited

U.S. PATENT DOCUMENTS

| | | | |
|---|---|---|---|
| 5,480,823 A | 1/1996 | Hsu | |
| 6,252,293 B1 | 6/2001 | Seyyedy et al. | |
| 6,255,167 B1 | 7/2001 | Wu | |
| 6,630,724 B1 * | 10/2003 | Marr | G11C 17/16 257/530 |
| 6,667,902 B2 | 12/2003 | Peng | |

(Continued)

OTHER PUBLICATIONS

"Into High Gear," SOI Industry Consortium, Dec. 3, 2008, 7 pages, [Online] [Retrieved on Jun. 28, 2018] Retrieved from the Internet<URL: http://soiconsortium.eu/2008/12/03/into-high-gear/>.

(Continued)

*Primary Examiner* — Alfredo Bermudez Lozada
(74) *Attorney, Agent, or Firm* — Fenwick & West LLP (57) ABSTRACT

A one-time programmable memory device includes a first doped region in a semiconductor substrate, a second doped region implanted within the first doped region, and a gate positioned over the second doped region. The first doped region and second doped regions form a diode. A first contact is coupled to the first doped region for applying a voltage to the first doped region. The gate includes a dielectric portion that is capacitively coupled to the second doped region. The gate also includes a conductive portion that is coupled to a second contact for applying a voltage to the conductive portion. The voltage applied to the conductive portion is independent from the voltage applied to the first doped region. The memory device is programmed by forming a rupture in the dielectric portion of the gate.

20 Claims, 5 Drawing Sheets

(56) References Cited

U.S. PATENT DOCUMENTS

| | | | |
|---|---|---|---|
| 6,713,839 | B2 | 3/2004 | Madurawe |
| 6,898,116 | B2 | 5/2005 | Peng |
| 6,940,751 | B2 | 9/2005 | Peng et al. |
| 6,992,925 | B2 | 1/2006 | Peng |
| 7,110,278 | B2 | 9/2006 | Keshavarzi et al. |
| 7,126,204 | B2 | 10/2006 | Frey et al. |
| 7,507,607 | B1 | 3/2009 | Dark et al. |
| 7,638,855 | B2 | 12/2009 | Lung |
| 8,330,189 | B2 | 12/2012 | Luan et al. |
| 8,644,049 | B2 | 2/2014 | Chung |
| 9,007,805 | B2 | 4/2015 | Lu et al. |
| 9,887,201 | B2 | 2/2018 | Luan |
| 2004/0155315 | A1 | 8/2004 | Marr et al. |
| 2004/0156234 | A1* | 8/2004 | Peng ............... G11C 17/12 365/177 |
| 2006/0203591 | A1 | 9/2006 | Lee |
| 2007/0120171 | A1 | 5/2007 | He et al. |
| 2007/0183181 | A1 | 8/2007 | Peng et al. |
| 2007/0205485 | A1 | 9/2007 | Hsu et al. |
| 2009/0052220 | A1* | 2/2009 | Kleveland ........ G11C 17/16 365/96 |
| 2011/0298054 | A1 | 12/2011 | Luan |
| 2012/0047322 | A1* | 2/2012 | Chung ............... G06F 9/328 711/103 |
| 2012/0147653 | A1 | 6/2012 | Chung |
| 2013/0161761 | A1 | 6/2013 | Luan et al. |
| 2014/0035014 | A1 | 2/2014 | Jeon |
| 2016/0049190 | A1* | 2/2016 | Han ................. G11C 11/4076 365/51 |
| 2016/0293612 | A1* | 10/2016 | Park ................. H01L 27/11206 |

OTHER PUBLICATIONS

"Kilopass Embedded XPM Technology: A new Field Programmable Non-Volatile Memory," Kilopass Corporation, Jan. 29, 2009, 9 pages.

Kurjanowicz, W., "Evaluating Embedded Non-Volatile Memory for 65nm and Beyond," DesignCon 2008, Sidense Corp., 2008, 23 pages.

Kurjanowicz, W., "Evaluating Embedded Non-Volatile Memory for 65nm and Beyond," DesignCon 2008, International Engineering Consortium, DesignCon 2008, Feb. 4-7, 2008, pp. 176-188.

* cited by examiner

| Mode | N Contact | Gate Contact | E-Field @ Gate Oxide |
|---|---|---|---|
| Prog. Selected Row – Rupture | 0 to Diode Drop | $V_{rupt}$ | $(V_{rupt}-\text{Diode Drop})/T_{OX}$ |
| Prog. Selected Row – Inhibit | 0 | 0 | 0 |
| Prog. Unselected Row | $V_{rupt}$ | 0 or $V_{RUPT}$ | 0 or $V_{FN}/T_{OX}$ |
| Read Selected Row | 0 | Pre-charge $V_{DD}$ | $V_{DD}/T_{OX}$ |
| Read Unselected Row | $V_{DD}$ | Pre-charge $V_{DD}$ | 0 |
| Idle | 0 | 0 | 0 |

ONE-TIME PROGRAMMABLE BITCELL WITH DIODE UNDER ANTI-FUSE

CROSS REFERENCE TO RELATED APPLICATION

This application claims the benefit of U.S. Provisional Application No. 62/447,201, entitled "OTP BITCELL WITH A DIODE UNDER THE FUSE," filed on Jan. 17, 2017, which is incorporated by reference herein in its entirety.

BACKGROUND

This disclosure relates to one-time programmable bitcell, and more specifically to a one-time programmable bitcell that uses a diode under the anti-fuse gate instead of a select device.

As the semiconductor industry continues to integrate more and more devices onto a single chip, the need for One Time Programmable (OTP) memory integrated into various CMOS processes is needed. OTP memory bitcells typically include a select device and an anti-fuse device connected in series. The select device and anti-fuse device both have gate oxides, and the anti-fuse device has a much thinner gate oxide than the select device. The difference in the thickness of the gate oxides is critical for the bitcell to operate. The select device must be able to sustain, for a brief period, a voltage that is sufficient to rupture the thin gate oxide in the same period. If two gate oxide thicknesses are not available in a given process, the existing OTP solutions do not work.

Advanced CMOS processes are moving from silicon dioxide ($SiO_2$) gate dielectrics to gate dielectrics that are a composite of $SiO_2$ and a higher dielectric constant (referred to as "high-κ dielectrics," where κ is the dielectric constant). Many advanced CMOS processes have two gate dielectric thicknesses. The core or thin gate dielectric is made with an extremely thin $SiO_2$ layer under a high-κ dielectric. The I/O or thick gate dielectric is made with a thicker $SiO_2$ layer and the same high-κ dielectric on top of it. In such processes, the high-κ dielectric included in the core gate oxide might not be suitable for an anti-fuse gate in a typical OTP bitcell.

Most gate dielectrics in silicon processes have traps. Depending on the context, a "trap" can refer to both active and latent dielectric defects, or refer only to the active defects. When $SiO_2$ is grown on a silicon substrate, there is a crystal mismatch due to oxygen atom being smaller than the silicon atom. The oxygen and silicon ideal bond angle is 120°. As a result of the lattice mismatch between the silicon substrate and the $SiO_2$ grown on it, the $SiO_2$ layer is amorphous with varying bond angles. The further the bond angle is from 120°, the weaker the bond will be. Silicon-to-oxygen bonds almost never form when the bond angle is less than 100° or greater than 170°. When the bond angle is outside of this range, the oxygen atom will not bond to the silicon, and a silicon atom will replace an oxygen atom in the lattice. Because of this replacement, the ratio of oxygen to silicon is less than 2:1 (as expected for $SiO_2$), and may be more like 1.99:1. When a silicon-to-silicon bond is formed inside a $SiO_2$ region, that bond is much weaker than the silicon-to-oxygen bonds. The silicon-to-silicon bond can be broken by a high electric field, or by current passing through the dielectric. The silicon-to-silicon bond also re-form through annealing, or healing with enough thermal energy or heat. When the silicon-to-silicon bond is intact, it acts like a dielectric. The intact silicon-to-silicon bond is referred to as latent defect, e-prime precursor, latent trap, or inactive trap. When the silicon-to-silicon bond is broken, it acts like a tiny conductive spot; an electron can move to, or "hop into," the conductive spot, stay some time, and then move or "hop" to another conductive spot. When the bond is broken, it is referred to as an active defect, e-prime center, or active trap. The high-κ dielectric materials used in advanced CMOS processes typically have even more traps than $SiO_2$.

Typically, when a gate oxide anti-fuse ruptures, the current is high enough for self-heating to cause a conductive filament to form through the gate oxide, shorting the conductive gate material to the silicon substrate below the gate oxide. This is known as gate rupture or hard breakdown. However, if the trap density in a dielectric is high, then soft breakdown is possible. Soft breakdown occurs when enough traps become active that the leakage current mimics the result of a rupture. The difference between hard and soft breakdown is that soft breakdowns, unlike hard breakdowns, can anneal (i.e., heal). During a typical OTP anti-fuse rupture, the electric fields and current through the dielectric is high enough to first activate all or almost all of the traps to create a preferred localized current path, and then the high current heats the localized spot sufficiently to form a silicon filament through the gate dielectric. If the current is high enough to activate the traps but not high enough to form a filament, the activated traps can anneal or heal at room temperature, causing an anti-fuse that should have been ruptured to flip to an intact state. This means if the trap density is high enough, the thin gate dielectrics in some advanced CMOS processes are not reliable enough for use as OTP gate rupture anti-fuses. In these processes, it might be necessary to use the thick gate dielectric for the anti-fuse element. The thicker oxide relies on the $SiO_2$ portion of the gate stack being thick enough and having low enough trap density to avoid soft break down. If the thick gate dielectric is used for the anti-fuse element, the typical OTP architecture with two gates of different thicknesses is no longer suitable.

Another problem for OTP gate oxide rupture scaling is that as feature sizes get smaller, the thin gate oxide area gets smaller. In very small areas it might be possible not to have any silicon-silicon traps. The lattice mismatch causes some trap density, but in a given very small area there might not be any traps. This results in fraction of the anti-fuses that require a much higher voltage to rupture. The voltage and current required to rupture these anti-fuses without traps might exceed the capabilities of the select device. In these technologies, a bitcell without a select device might be needed.

For gate oxide rupture OTP bitcells to form a good filament during rupture, a high current is needed. In very small bitcells, the select device can limit the current to below what is needed to cause a soft break down to a hard breakdown. In some technologies, a bitcell with either a much larger select device or a bitcell without a select device might be needed.

There are other reasons that an OTP bitcell with two gate oxides may not be suitable or possible. For example, certain processes only have one gate oxide available. For example, some BCD (Bipolar complementary metal-oxide-semiconductor (CMOS) double-diffused metal-oxide-semiconductor (DMOS)) processes have either only one gate oxide, or two gate oxides where the second gate oxide is not usable. An example of this would be a 0.18 μm 5V/40V process. In this process, the 40V DMOS device uses a 5V gate oxide to control the device. The drain is engineered to handle 40V with a 5V gate controlling it, so only one gate oxide is needed. If a 5V/40V process does have a 40V gate oxide, the 40V device is so large that using it as a select device may result in an unacceptably large bitcell.

Floating gate many times programmable (MTP) non-volatile memories (NVM) typically use Fowler-Nordheim tunneling ("FN-tunneling") for either erasing or programming, or both. Many high endurance, high reliability floating gate NVMs use an electric field of around 10 MV/cm across the gate oxide to program or erase a floating gate in the specified time. There are floating gate NVMs available that can achieve 100,000 program/erase cycles, and more than 10 years' data retention using FN-Tunnel voltages of 10 MV/cm or higher.

OTP gate oxide memories typically use an electric field of around 30 MV/cm to rupture anti-fuses in the gate oxide. This 30 MV/cm is a compromise voltage that balances the demands of programming speeds and stresses on the chip. Many applications program the OTP memory at test, and testing time is a significant portion of the total manufacturing cost of a chip. Using higher voltages reduces the programming time, thus reducing test costs and overall manufacturing cost.

SUMMARY

Embodiments relate to a one-time programmable (OTP) memory device in which each bitcell has a single gate, rather than two gates of two different thicknesses. The gate dielectric is ruptured to program the OTP bitcell. Rather than using a select device for selective reading and programming, the OTP bitcell has a diode directly under the gate oxide that is used to select a bitcell. The diode is formed by two doped regions layered under the gate. The upper portion of the diode directly under the gate is "floating," which means that it has no ohmic connection to any other control logic or with other bitcells. The bitcell is arranged in an array of bitcells, with multiple gates each connecting a column of bitcells, and multiple lower doped regions each connecting a row of bitcells. When each diode is reverse biased, the voltage of the floating region is set by the reverse bias diode leakage and tunneling current through the gate oxide. During programming of a selected bitcell, the diode is used to prevent gates of the unselected bitcells from being unintentionally ruptured. The diodes are also used to isolate and read any single cell in the array.

In some embodiments, an OTP memory device includes a first doped region in a semiconductor substrate, a second doped region implanted within the first doped region, and a gate positioned over the second doped region. The first doped region and second doped regions form a diode. A first contact is coupled to the first doped region for applying a voltage to the first doped region. The gate includes a dielectric portion that is capacitively coupled to the second doped region. The gate also includes a conductive portion that is coupled to a second contact for applying a voltage to the conductive portion. The voltage applied to the conductive portion is independent from the voltage applied to the first doped region. The memory device is programmed by forming a rupture in the dielectric portion of the gate.

DETAILED DESCRIPTION

Embodiments relate to a one-time programmable (OTP) memory device in which each bitcell is connected to a single gate, and a diode underneath the gate replaces the select device of prior OTP bit rupture memories. Rupturing the gate dielectric at a bitcell programs the bitcell. OTP gate oxide rupture memories typically include bitcells arranged as a two-dimensional array. Bitcells in the array are connected to other bitcells in two directions, e.g., a column direction and a row direction. In the single-gate OTP memories disclosed herein, each bitcell includes a first doped region (e.g., an N-well), a second doped region implanted within the first doped region (e.g., a P+ region), and a gate above the second doped region. The two doped regions form the diode under the gate. Each gate extends across and connects multiple bitcells in one direction (e.g., as columns), and each N-well extends across and connects multiple bitcells in a perpendicular direction (e.g., as rows). The P+ regions of each bitcell is floating between the N-well and the gate. To program a bitcell, the gate connected to the selected bitcell is raised to a rupture voltage, while the N-well of the selected bitcell is held to ground.

When the rupture voltage is applied to the gate of the bitcell being programmed, the other bitcells connected to the same gate can be inhibited from rupturing by applying the same rupture voltage to the N-wells of these bitcells. However, the rupture voltage is also applied to the N-wells of the other bitcells whose gates are not raised to the rupture voltage. The diode structure with the floating P+ region prevents damage (e.g., unintended rupturing) of the bitcells that have the rupture voltage applied to their N-wells, but not to their gates. The designs of the OTP memory devices disclosed herein take advantage of the fact that the FN-tunnel voltage for a floating gate NVM bitcell is suitable to be used as the inhibit voltage for an OTP gate rupture bitcell. The 30 MV/cm voltage typically used for OTP memories is approximately three times that of a typical voltage used to program and erase a floating gate many times programmable (MTP) floating gate bitcell.

The bitcell may be created using a standard complementary metal-oxide-semiconductor manufacturing processes ("CMOS processes"). In some embodiments, a BCD (bipolar CMOS DMOS) CMOS process is used. "OTP bitcell," "bitcell" or "bit" described herein refers to any CMOS type (i.e., transistor based) nonvolatile memory device. A CMOS OTP bitcell is distinguished from other types of NVMs such as magnetic memory, such as is found in floppy disks, or optical memory such as is found in CDs or DVDs. OTP bitcells are produced using a CMOS process that includes a number of process steps in a fabrication facility ("fab").

OTP Memory Device with Diode Under Anti-Fuse

Figure 1:
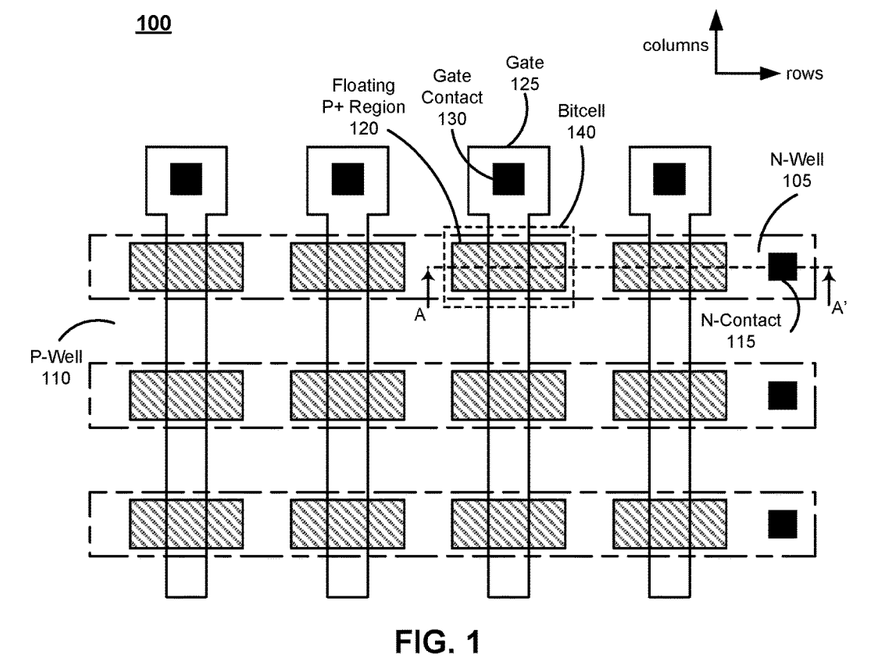
FIG. 1 illustrates a top view of an OTP memory device with a diode under an anti-fuse gate, according to one embodiment.

FIG. 1 illustrates a top view of an OTP memory device 100, according to one embodiment. The memory device 100 includes an N-well 105 and an adjacent P-well 110. The N-well 105 and P-well 110 are formed in a semiconductor substrate. The N-well 105 is a region implanted with a first dopant, and the P-well 110 is a region implanted with a second dopant. The OTP memory device 100 includes a series of N-wells, similar to N-well 105. As shown in FIG. 1, the N-wells extend as rows. The N-wells are separated from each other by P-wells, which are similar to P-well 110 and are formed between the N-wells. The P-wells electrically separate the N-wells from each other. In alternate embodiments, rather than using P-wells to separate the N-wells, deep trench isolation extending below the bottoms of the N-wells is used to separate the N-wells. An N-contact 115 is coupled to the N-well 105 to apply a voltage to the N-well 105; as shown in FIG. 1, the N-contact 115 connects to one end of the N-well 105. Similar N-contacts are coupled to the other N-wells.

Figure 2:
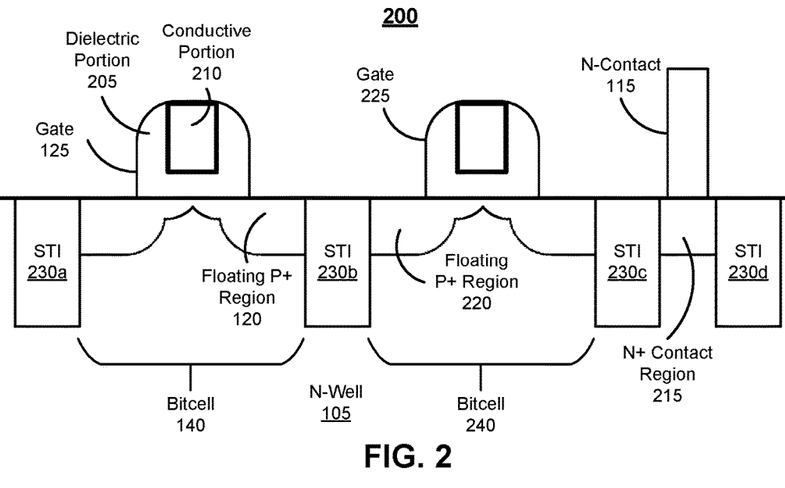
FIG. 2 is a cross sectional diagram of two OTP bitcells taken along line A-A' of FIG. 1, according to one embodiment.

A floating P+ region 120 is implanted within the N-well 105. The floating P+ region 120 has the opposite polarity of the N-well 105 in which it is formed. The floating P+ region 120 and the portion of the N-well 105 directly below the floating P+ region 120 forms a diode. Each N-well includes a series of floating P+ regions, similar to floating P+ region 120, drawn in FIG. 1 as shaded rectangles. The floating P+ regions may be separated from neighboring P+ regions within the same N-well by shallow trench isolation, as shown in FIG. 2. The borders of the N-wells 105 and the P-wells 110 electrically separate the P+ regions 120 in adjacent rows.

The memory device 100 also includes multiple gates, such as gate 125, which extend as columns. The gate 125 is formed on top of the substrate in which the N-well 105, P-well 110, and floating P+ region 120 are formed. The gate 125 includes a conductive portion and a dielectric portion (e.g., a gate oxide) below the conductive portion, as described below with reference to FIG. 2. A gate contact 130 is coupled to the gate 125 to apply a voltage to a conductive portion of the gate 125; as shown in FIG. 1, a gate contact 130 connects to the top of the gate 125 to apply a voltage to the gate 125. The OTP memory device includes a series of gates with gate contacts similar to the gate 125 with gate contact 130.

The gate 125 is small enough to allow the floating P+ region 120 to short underneath the gate 125. As described above, it is common for CMOS processes to have to sets of devices, core devices and I/O devices. The core devices have a thinner gate dielectric, shorter minimum lengths, and shallower lightly doped drain (LDD) or source/drain extension implants than the I/O devices. By combining the minimum length allowed on the core device with the I/O LDD implants, the floating P+ region 120 can be merged under the gate 125, as shown in FIG. 2 and described further below.

As shown in FIG. 1, a single N-contact 115 applies a voltage to each N-well 105, and a single gate contact 130 applies a voltage to each gate 125. In other embodiments, multiple contacts connect to each N-well 105 and/or gate 125 (e.g., for redundancy), with the same voltage applied to each of the multiple contacts.

The floating P+ region 120 is formed at the intersection of the N-well 105 and the gate 125. The floating P+ region 120 extends across the full width of the gate 125, so that the floating P+ region 120 separates the gate 125 from the N-well 105, and the gate 125 is not in contact with the N-well 105. The N-well 105, P+ region 120, and gate 125 together form a single bitcell 140. Voltages are applied to the bitcell 140 via the gate contact 130 and the N-contact 115. Additional bitcells are formed at the other floating P+ regions, and each bitcell includes a floating P+ region, a gate, and an N-well. The memory device 100 includes twelve bitcells. The memory device 100 may have many more bitcells than are shown in FIG. 1, and the bitcells have a different arrangement from FIG. 1; for example, the gates can extend as rows, and the N-wells as columns.

To read the bitcell 140, the diode formed by the N-well 105 and the P+ region 120 (referred to herein as a "P+/NW diode") is forward biased. The P+/NW diodes of the other bitcells on the N-well 105 are also forward biased, while the P+/NW diodes of bitcells formed on the other N-wells not being read are reverse biased. To program the bitcell 140 (i.e., to rupture a portion of the gate dielectric of the gate 125 above the floating P+ region 120), a rupture voltage is applied to the gate 125, while the N-well 105 is held at ground. The gates of the other bitcells in the N-well 105 (also referred to as the selected row) are grounded, and the N-wells of the other bitcells along the gate 125 (also referred to as the selected column) are raised to the rupture voltage. The bitcells that are neither in the N-well 105 nor along the gate 125 (i.e., not along the selected row or selected column) have the rupture voltage applied to their N-wells while their gates are held to ground. The diodes of these bitcells are reverse biased, and the voltage of their floating P+ regions are set by the reverse bias diode leakage and an FN-tunneling current through the dielectric portions of the gates. When the FN-tunneling current is high, this clamps the voltage in the floating P+ region to a fraction of the rupture voltage and these bitcells from being accidentally programmed. The electrical operation of the bitcell 140 and the other bitcells in the memory device 100 are described in further detail with respect to FIGS. 3 and 4.

FIG. 2 is a cross sectional diagram 200 of two OTP bitcells 140 and 240 taken along line A-A' of FIG. 1, according to one embodiment. The OTP bitcell 240 corresponds to the bitcell between the bitcell 140 and the N-contact 115 in FIG. 1. The cross sectional diagram 200 shows many of the same components as FIG. 1. The bitcell 140 includes the N-well 105, the floating P+ region 120, and the gate 125. The neighboring bitcell 240 includes the same N-well 105, a floating P+ region 220, and a gate 225. The gate 125 includes a dielectric portion 205 and a conductive portion 210. The dielectric portion 205 may be a gate oxide or a combination of a gate oxide and another dielectric, and the conductive portion 210 may be polysilicon. The gate 225 also includes a dielectric portion and a conductive portion. An N+ contact region 215 connects to the N-contact 115 to transfer a voltage applied to the N-contact 115 to the N-well 105.

The floating P+ regions 120 and 220 of the two bitcells 140 and 240 are separated by shallow trench isolation (STI) 230b. STI 230a electrically separates the floating P+ region 120 from a bitcell on the other side of bitcell 140 (not shown in FIG. 2), and STIs 230c and 230d electrically isolate the N+ contact region 215. In alternate embodiments, N+ regions are used to separate and isolate adjacent P+ regions in the N-well 105, rather than using STI 230. As shown in FIG. 2, the P+ regions 120 and 220, isolated by the STI 230, are not directly coupled to any circuitry or other bitcells, and thus these regions are considered "floating." The voltage of each floating P+ region 120 and 220 is controlled by (1) the P+/NW diode formed by the floating P+ region 120 or 220 and the N-well 105, and (2) any current flowing through the gate dielectric portion 205.

During fabrication, the gates 125 and 225 are deposited before the floating P+ regions 120 and 220 are implanted in the N-well 105. As shown in FIG. 2, the floating P+ regions 120 and 220 are formed by a P-lightly doped drain (P-LDD) and a P+ source/drain (SD) implant. The gates 125 and 225 are sufficiently narrow that the p-type implants merge under the gates 125 and 225, forming a single floating P+ region 120 or 220 underneath each gate. Alternatively, the p-type implanting can be performed to form the floating P+ regions 120 and 220 before the gates 125 and 225 are deposited. Any p-type implant that is extends to a depth that is shallower than the bottoms of the STIs 230 (so that neighboring P+ regions are electrically isolated) is suitable. A p-type implanting step can be added to a process, or existing implanting steps of a fabrication process, such as NMOS VT adjust implant or a p-base implant for an NPN BPJ transistor, may be used.

The dielectric portion 205 of the gate 125 may be a gate oxide (e.g., silicon oxide) or other insulating material. During programming of the bitcell 140, the gate contact 130 shown in FIG. 1 applies a high voltage, referred to as a rupture voltage, to the gate 125, while the N-well 105 is grounded. This high voltage difference ruptures the dielectric portion 205 of the gate 125, creating a short or an "anti-fuse" (not shown in FIG. 2) that allows current to flow though the dielectric portion 205 during reading of the bitcell 140.

Programming the OTP Memory Device with Diode Under Anti-Fuse

Figure 3:
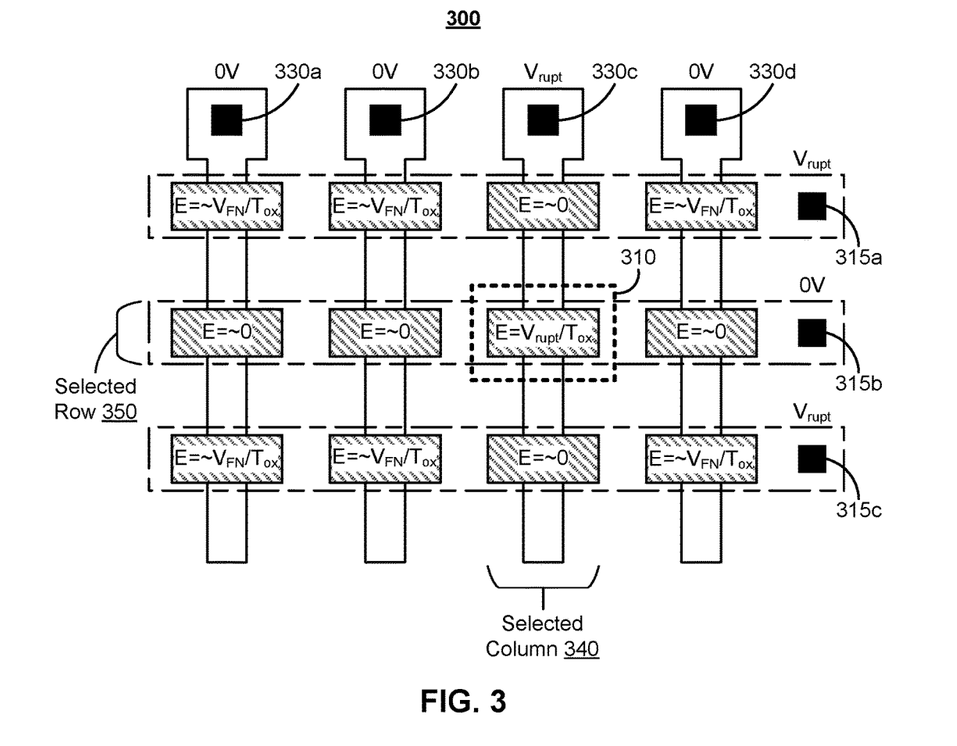
FIG. 3 is a top view of an OTP memory device showing voltages for programming a selected bitcell and inhibiting the other bitcells, according to one embodiment.

FIG. 3 is a top view of an OTP memory device 300 showing voltages for programming a selected bitcell 310 and inhibiting the other bitcells, according to one embodiment. The OTP memory device 300 is similar to the OTP memory device 100 shown in FIG. 1. FIG. 3 shows the voltages applied to each gate contact 330a through 330d, which are similar to gate contact 130, and the voltages applied to each N-contact 315a though 315c, which are similar to N-contact 115. FIG. 3 also shows the electric field across the gate dielectric of each bitcell.

The bitcell 310 being programmed (i.e., the "selected bitcell") is controlled by a gate contact 330c, to which the rupture voltage $V_{rupt}$ is applied, and an N-contact 315b, which is grounded at 0V. Here, $V_{rupt}$ may be the sum of the voltage that ruptures the gate dielectric plus the diode drop voltage of the P+/NW diode formed by the floating P+ region and the N-well. When the floating P+ region of the bitcell 310 goes above the diode drop voltage, the P+/NW diode is forward biased, and the floating P+ region is held to a maximum voltage of the diode drop voltage. The electric field across the gate dielectric of the selected bitcell 310 is $V_{rupt}/T_{ox}$, where $T_{ox}$ is the thickness of the gate dielectric (here, an oxide). $V_{rupt}$ is sufficiently high to rupture a gate dielectric with thickness $T_{ox}$ when the voltage on the floating P+ region is no higher than the diode drop voltage.

In some processes, when the gate dielectric ruptures, the PNP bipolar transistor formed by the floating P+ region, the N-Well, and the P-Well adjacent to the N-well can turn on, allowing more current to flow through the anti-fuse. This can help ensure there is enough current to ensure hard breakdown. If additional current is needed to form the rupture, the area of the floating P+ region can be enlarged, and the distance from a bitcell to an N-contact can be reduced to limit the resistance in the N-well from unacceptably limiting current.

The bitcells along the gate that is controlled by gate contact 330c are in the selected column 340, and the bitcells along the N-well that is controlled by N-contact 315b are in the selected row 350. The non-selected bitcells along the selected column 340 also have $V_{rupt}$ applied at their gate. To inhibit these bitcells from rupturing, $V_{rupt}$ is also applied to the N-contacts 315a and 315c. The floating P+ region of these bitcells is capacitively coupled up to approximately $V_{rupt}$, so that the electric field across the non-selected bitcells in the selected column 340 is approximately 0. The non-selected bitcells along the selected row 350 have a grounded N-well, like bitcell 310. To inhibit these bitcells from rupturing, the gates 330a, 330b, and 330d are grounded, so that the electric field across the non-selected bitcells in the selected row 350 is at 0 or approximately 0.

The bitcells that are in both a non-selected row and a non-selected column have a gate that is grounded by gate contact 330a, 330b, or 330d, and an N-well pulled up to $V_{rupt}$ by N-contact 315a or 315c. Under these voltage conditions, the P+/NW diode is reverse biased. The floating P+ region is capacitively coupled to both the N-well and the gate, so that it is set to a voltage between $V_{rupt}$ and 0V. When the floating P+ region voltage is low, the reverse bias P+/NW diode leakage is greater than the FN-Tunnel current through the gate dielectric. However, as the voltage across the gate oxide approaches the voltage typically used to program MTP NVM cells (~⅓ of $V_{rupt}$), the FN-Tunnel current becomes larger than the diode leakage. So, the P+ region is clamped at around one-third to one-half of $V_{rupt}$, depending on the ramp rate of the N-well. Because the configuration of the bitcell keeps the voltage on the floating P+ region no higher than about half of $V_{rupt}$, this prevents the gate dielectric from being ruptured. The electric field across the gate dielectric is approximately the FN tunneling voltage divided by the gate dielectric thickness, which is the same as the electric field a MTP floating NVM gate bitcell would see during programming. In operation of floating gate MTP NVM bitcells, no significant damage is done to the gate oxide during program to ensure long term memory retention.

Example Table of Operations

Figure 4:
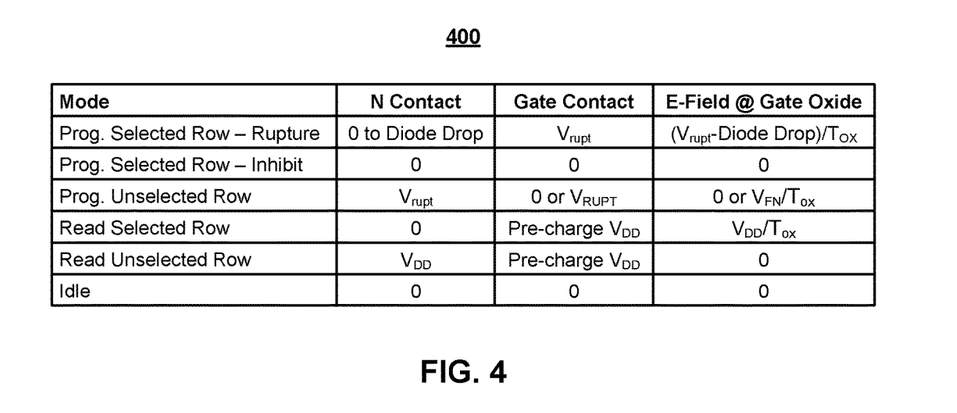
FIG. 4 shows a table of operation voltages of an OTP memory device, according to one embodiment.

FIG. 4 shows a table of operation voltages 400 of an OTP memory device, such as the OTP memory device 100 or 300, according to an embodiment. The table of operation voltages 400 provides identifiers of voltage levels at different points in a memory device (given along the top of the table) and for different operations (given along the left side of the table).

In the example of FIG. 4, the N-wells are arranged as rows, and the gates are arranged as columns. Each read and program operation has at least two bias conditions, one for the row being read or programmed (selected) and one for the other rows (unselected). $V_{rupt}$ is the high voltage used to rupture the gate oxide when a bitcell is being programmed. $V_{DD}$ refers to the power supply voltage for the bitcell. $V_{FN}$ refers to the FN tunneling voltage, which is typically around one-half or one-third of $V_{rupt}$. Diode Drop refers to the diode drop voltage of the forward biased P+/NW diode. It is assumed that $V_{DD}$ is significantly larger than the diode drop voltage. $T_{ox}$ is the thickness of the gate oxide (or other gate dielectric material).

The read operation works by biasing the bitcells in the memory device such that the P+SD/NW diodes on the row being read (the selected row) are forward biased, and the P+SD/NW diodes on other rows (the unselected rows) are reverse biased. The read operation starts with the power supply voltage $V_{DD}$ applied to all gate contacts and all N-well contacts. The N-well contact of the selected row is then brought to ground, and the conductive portions of the gates (e.g., a polysilicon line, or "poly line") are floated. In the selected row, the floating P+ regions and poly lines of the bitcells with a ruptured gate dielectric are pulled down to a diode drop above ground. Any other bitcells having a ruptured gate dielectric and sharing the poly line being pulled down also have their floating P+ regions pulled down, but the reversed biased P+/NW diode of these bitcells prevents the N-wells of the other rows from affecting the voltage of the poly line. Accordingly, all of the poly lines in the selected row with ruptured gate oxide are pulled down, and the poly lines on the selected row with intact gate oxides float. Read circuitry connected to the poly lines can sense which anti-fuses on the selected row have been ruptured and which have not. In alternate embodiment, the poly lines are held a fixed voltage and the N-wells are pulled up through the anti-fuse if a bitcell has been ruptured. In this embodiment, the read circuitry is connected to the N-wells rather than the poly lines. Depending on the process, it is possible for a PNP bipolar junction to turn on during read to aid in the reading of the bitcell.

Alternate Embodiment with Floating P-LDD Region

Figure 5:
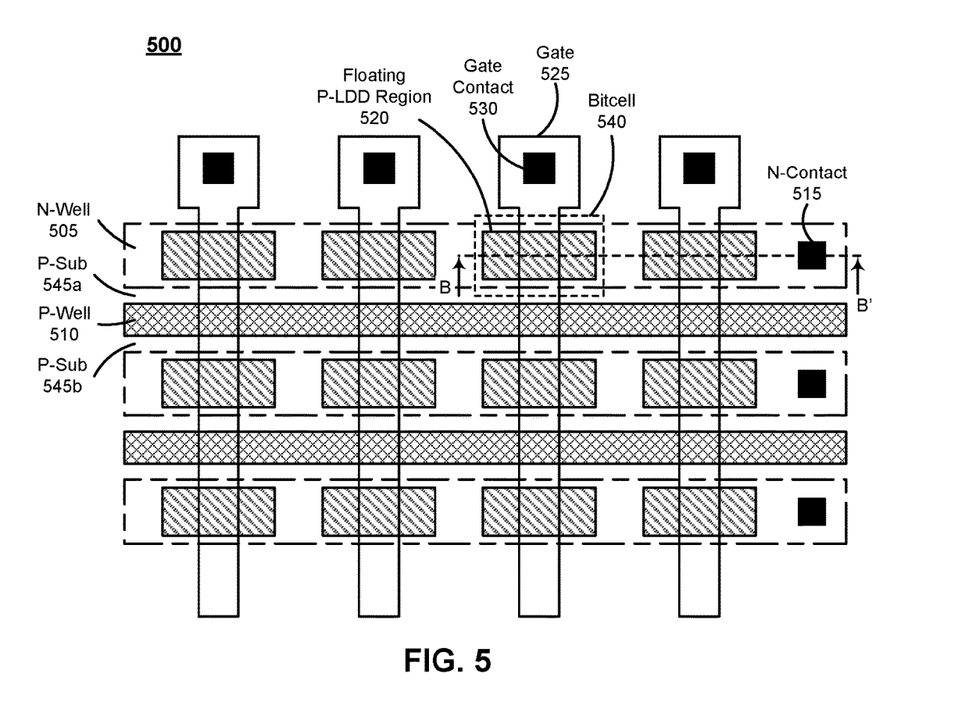
FIG. 5 is a top view of an alternate embodiment of an OTP memory with a diode under an anti-fuse gate, according to one embodiment.

FIG. 5 is a top view of an alternate embodiment of an OTP memory 500 with a diode under an anti-fuse gate, according to one embodiment. The OTP memory 500 includes a series of N-wells, including N-well 505, which are similar to N-well 105 of FIG. 1, and a series of gates, such as gate 525, which are similar to the gate 125 of FIG. 1. Each N-well has an N-contact, such as N-contact 515, to apply a voltage to the N-well, and each gate has a gate contact, such as gate contact 530, to apply a voltage to the gate. A bitcell, such as bitcell 540, is formed at each intersection of a gate and an N-well. In FIG. 5, a floating P-LDD region 520, which is a lightly doped drain (LDD) region with p-type doping, is used without the source/drain implant shown in FIG. 2. A P-LDD region has a lower dopant concentration than a P+ region, e.g., at least a 10 times lower dopant concentration. Using P-LDD rather than P+ doping increases the reverse breakdown voltage of the diode. In some processes, the reverse breakdown voltage may be lower than the voltage across the reverse biased P+/NW diodes in non-selected rows and non-selected columns during programming of a selected bitcells. In such processes, the reverse breakdown voltage can be increased by using a lower dopant concentration in the floating p-doped region, so that the diode is a P-LDD/NW diode, rather than a P+/NW diode.

In addition, P-sub regions are included as buffers between the N-wells and the P-wells that separate the N-wells. As shown in FIG. 5, P-well 510 is surrounded by two P-sub regions 545a and 545b. The N-well 505 is formed on the other side of the P-sub region 545a; another unlabeled N-well is formed on the other side of the P-sub region 545b. The P-sub regions 545a and 545b increase the P+/NW diode breakdown voltage; the breakdown voltage of an NW/P-Sub/PW arrangement is much higher than the breakdown voltage between a P-Well and N-Well.

Figure 6:
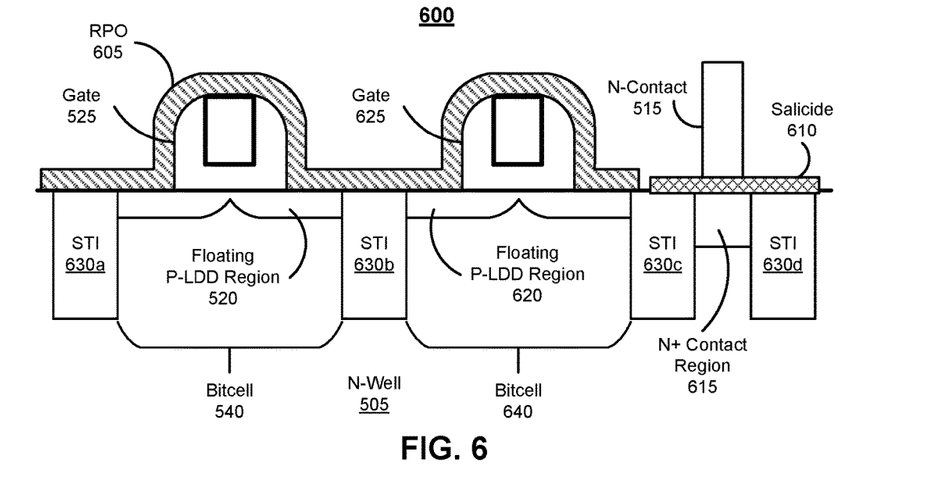
FIG. 6 is a cross sectional diagram of two OTP bitcells taken along line B-B' of FIG. 5, according to one embodiment.

FIG. 6 is a cross sectional diagram 600 of two OTP bitcells 540 and 640 taken along line B-B' of FIG. 5, according to one embodiment. The OTP bitcell 640 corresponds to the bitcell between the bitcell 540 and the N-contact 515 in FIG. 5. The cross sectional diagram 600 shows many of the same components as FIG. 5. The bitcell 540 includes the N-well 505, the floating P-LDD region 520, and the gate 525. The neighboring bitcell 640 includes the same N-well 505, a floating P-LDD region 620, and a gate 625. The gates 525 and 625 each include a dielectric portion and a conductive portion, similar to the dielectric portion 205 and conductive portion 210 shown in FIG. 2. The floating P-LDD regions 520 and 620 of the two bitcells 540 and 640 are separated by shallow trench isolation (STI) 630b; STI 630a electrically separates the floating P-LDD region 520 from the bitcell to the left of bitcell 540 (not shown in FIG. 6), and STIs 630c and 630d electrically isolate an N+ contact region 615. The N+ contact region 615 connects to the N-contact 515 to transfer a voltage applied to the N-contact 515 to the N-well 505.

In some processes, a salicide layer is formed over transistors in the process to reduce the resistance of the gates and diffusion regions. A salicide is a self-aligned silicide that is formed by reacting metal with silicon. As shown in FIG. 6, a salicide 610 is formed over the STIs 630c and 630d and the N+ contact region 615. A layer of Resist Protect Oxide (RPO) is formed over the bitcells 540 and 640 to prevent salicide from being formed over the floating P-LDD regions 520 and 620 during the salicide formation. Forming a salicide consumes silicon on the wafer, and the salicide partially embeds into the silicon. During programming of a bitcell of the memory device 500, a short is formed in the gate dielectric between the gate and the p-doped region. The doping concentration and depth of the junction of a P+ region, such as the floating P+ region 120, is typically sufficient to prevent the depletion region formed in the reverse bias P+/NW diode (e.g., when the P+ region is at $V_{rupt}$ and the NW at ground) from extending up to and touching the salicide region. Thus, a salicide can be formed across the memory device 100, including the floating P+ regions. However, the low doping in the floating P-LDD regions 520 and 620 may not be sufficient to buffer a salicide formed over the floating P-LDD regions 520 and 620 from the N-well 505. In particular, if the depletion layer of the floating P-LDD region 520 or 620 formed at the junction of the P-LDD region and the N-well 505 touches the salicide layer, high leakage could occur from the salicide to the N-well 505. Thus, during the salicide process, the floating P-LDD regions 520 and 620 are blocked by the RPO 605 to prevent salicide from forming on the floating P-LDD regions 520 and 620. RPO is also called SAB (SAlcide Block), or SB or OP.

Additional Alternate Embodiments

Although the above embodiments were described primarily with reference to processes with floating P+ or P-LDD regions formed in N-wells that are separated by P-wells, the dopant types can be reversed. Isolated P-wells can be used to form bitcells with N+/PW diodes, where the P-wells are isolated from each other by N-wells.

As an example, in bipolar CMOS DMOS (BCD) processes, there are often high voltage (HV) wells that are used for DMOS devices. In addition, some BCD processes have N+ buried layers (NBLs). The NBLs and high-voltage N-wells can be used to form isolated high-voltage P-wells, in which bitcells with N+/PW diodes can be formed. Further, using high voltage N-wells or P-wells can increase the P+/NW or N+/PW diode breakdown. These processes can sometime use both shallow and deep trench isolation schemes. If a process has both shallow and deep trench isolation, then the array can be formed in one N-well with the bitcell sharing and N-wells isolated with shallow trenches, and bitcells with separate N-wells being isolated by deep trenches. In silicon on insulator (SOI) processes, each bitcell can be fully isolated with oxide.

Overview of Electronic Design Automation Design Flow

Figure 7:
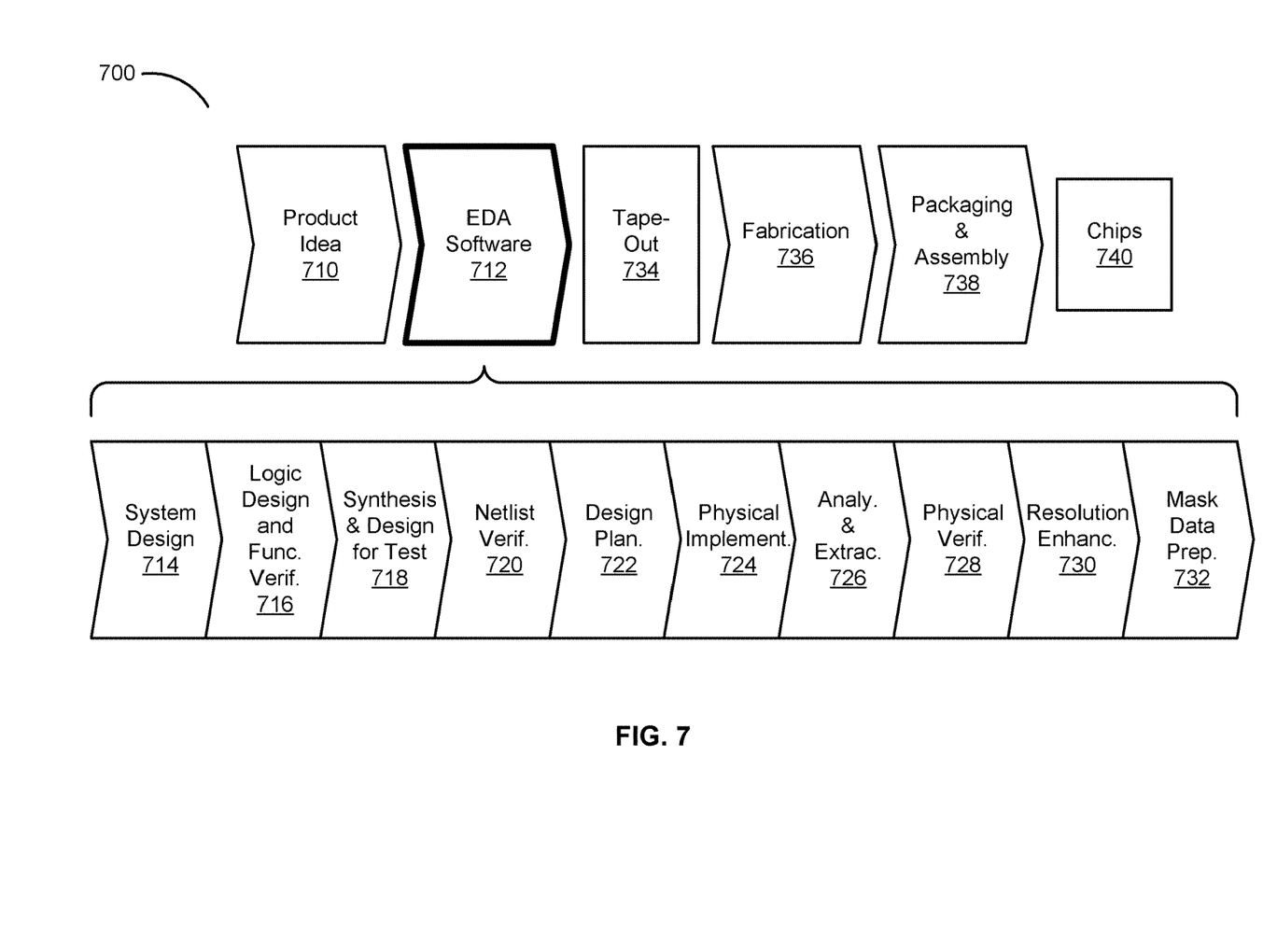
FIG. 7 is a flowchart illustrating the various operations in the design and fabrication of an integrated circuit, according to one embodiment.

FIG. 7 is a flowchart 700 illustrating the various operations in the design and fabrication of an integrated circuit.

This process starts with the generation of a product idea 710, which is realized during a design process that uses electronic design automation (EDA) software 712. When the design is finalized, it can be taped-out 734. After tape-out, a semiconductor die is fabricated 736 to form the various objects (e.g., a bitcell including gates, metal layers, vias) in the integrated circuit design. Packaging and assembly processes 738 are performed, which result in finished chips 740.

The EDA software 712 may be implemented in one or more computing devices including a memory. An example of a memory is a non-transitory computer readable storage medium. For example, the EDA software 712 is stored as instructions in the computer-readable storage medium which are executed by a processor for performing operations 714-732 of the design flow, which are described below. This design flow description is for illustration purposes. In particular, this description is not meant to limit the present disclosure. For example, an actual integrated circuit design may require a designer to perform the design operations in a difference sequence than the sequence described herein.

A cell library incorporating one or more NVM bitcells or circuits as described above with reference to FIGS. 1 through 6 may be stored in the memory. The cell library may be referenced by the EDA software 712 to create a circuit or electronic device incorporating the NVM bitcells or circuits.

During system design 714, designers describe the functionality to implement. They can also perform what-if planning to refine the functionality and to check costs. Note that hardware-software architecture partitioning can occur at this stage. During logic design and functional verification 716, VHDL or Verilog code for modules in the circuit is written and the design is checked for functional accuracy. More specifically, the design is checked to ensure that it produces the correct outputs. During synthesis and design for test 718, VHDL/Verilog is translated to a netlist. This netlist can be optimized for the target technology. Additionally, tests can be designed and implemented to check the finished chips. During netlist verification 720, the netlist is checked for compliance with timing constraints and for correspondence with the VHDL/Verilog source code.

During design planning 722, an overall floor plan for the chip is constructed and analyzed for timing and top-level routing. Example EDA software products from Synopsys, Inc. of Mountain View, Calif. that can be used at this stage include: Astro® and IC Compiler® products. During physical implementation 724, the placement (positioning of circuit elements) and routing (connection of the same) occurs. During analysis and extraction 726, the circuit function is verified at a transistor level, which permits refinement. During physical verification 728, the design is checked to ensure correctness for: manufacturing, electrical issues, lithographic issues, and circuitry. During resolution enhancement 730, geometric manipulations of the layout are performed to improve manufacturability of the design. During mask-data preparation 732, the 'tape-out' data for production of masks to produce finished chips is provided.

Embodiments of the present disclosure can be used during one or more of the above-described stages. Specifically, in some embodiments the present disclosure can be used in EDA software 712 that includes operations between design planning 722 and physical implementation 724.

Figure 8:
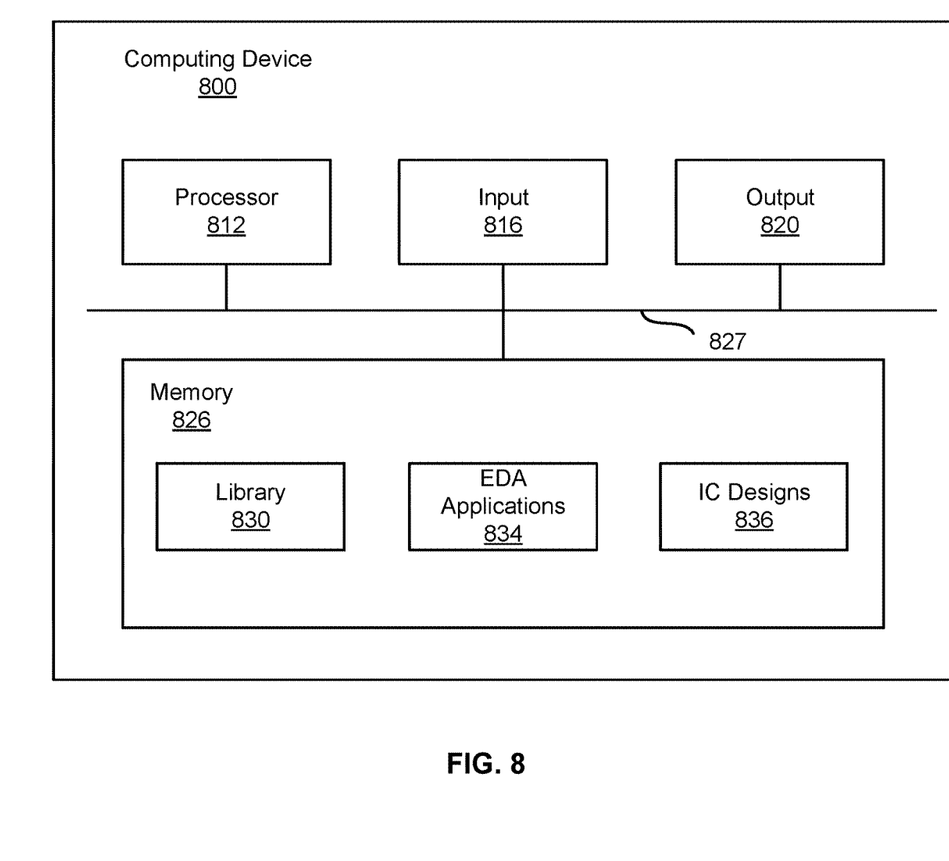
FIG. 8 is a block diagram of a computing device for designing a circuit, according to one embodiment.

FIG. 8 is a block diagram of a computing device 800 for performing designing operations associated with OTP memory devices. The computer device 800 may include, among other components, a processor 812, an input module 816, an output module 820, a memory 826 and a bus 827 for connecting these components. The processor 812 executes instructions stored in the memory 826. The input module 816 may include various devices for receiving user input, including keyboards and pointing devices (e.g., mouse and touch screen). The output module 820 includes a display device or interface device for communicating with the display device.

The memory 826 is a non-transitory computer readable storage medium storing, among others, library 830, electronic design automation (EDA) applications 834 and integrated circuit (IC) designs 836. The library 830 may include data on various circuit components, including instances of OTP memory device describe herein. The EDA applications 834 may include various software programs for designing ICs, including place and route tools, synthesis tools, and verification tools. The design processed by the EDA applications 834 may be stored in IC designs 836. The IC designs 836 may be an entire operational circuit or a part of a larger IC circuit.

The bitcell has wide applicability. For example, the bitcell may be used as an alternative to expensive flash memory. Flash memory is expensive because it requires a number of additional process steps to create that are not part of the standard CMOS logic process and it adds a significant amount of heat. In contrast, the bitcell can be constructed using existing logic processes with no additional process steps.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A one-time programmable memory device comprising a plurality of bitcells arranged in an array comprising rows and columns, a first bitcell of the plurality of bitcells comprising:
   a first doped region implanted in a semiconductor substrate, wherein the first doped region connects the first bitcell to a first subset of the plurality of bitcells in one of the rows of the array;
   a first contact coupled to the first doped region for applying a voltage to the first doped region;
   a second doped region implanted within the first doped region, the first doped region and the second doped region forming a diode; and
   a gate positioned over the second doped region, the gate comprising a dielectric portion capacitively coupled to the second doped region and a conductive portion, the conductive portion coupled to a second contact for applying a voltage to the conductive portion, the voltage applied to the conductive portion independent from the voltage applied to the first doped region, the first bitcell programmed by forming a rupture in the dielectric portion of the gate, wherein the gate connects the first bitcell to a second subset of the plurality of bitcells in one of the columns of the array,
   wherein, in response to reverse biasing the diode formed by the first doped region and the second doped region, the voltage of the second doped region is based on a reverse bias diode leakage and a tunneling current through the dielectric portion of the gate.

2. The one-time programmable memory device of claim 1, wherein the second doped region is floating.

3. The one-time programmable memory device of claim 1, wherein the second doped region extends across a width of the gate, the second doped region separating the gate from the first doped region.

4. The one-time programmable memory device of claim 1, wherein the first bitcell is read by forward biasing the diode formed by the first doped region and the second doped region.

5. The one-time programmable memory device of claim 1, wherein the first bitcell is programmed by applying a rupture voltage to the second contact, which causes the diode formed by the first doped region and the second doped region to be forward biased.

6. The one-time programmable memory device of claim 1, wherein the one of the columns is isolated from at least one adjacent column by shallow trench isolation, and the one of the rows is isolated from at least one adjacent row by one of a third doped region and a deep trench.

7. The one-time programmable memory device of claim 1, wherein the memory device is fabricated by a bipolar process, a complementary metal-oxide-semiconductor (CMOS) process, or a double-diffused metal-oxide-semiconductor (DMOS) process, and the first doped region is a high voltage well.

8. A one-time programmable memory device comprising a plurality of bitcells, a first bitcell of the plurality of bitcells comprising:
 a first doped region implanted in a semiconductor substrate;
 a first contact coupled to the first doped region for applying a voltage to the first doped region;
 a second doped region implanted within the first doped region, the first doped region and the second doped region forming a diode; and
 a gate positioned over the second doped region, the gate comprising a dielectric portion capacitively coupled to the second doped region and a conductive portion, the conductive portion coupled to a second contact for applying a voltage to the conductive portion, the voltage applied to the conductive portion independent from the voltage applied to the first doped region, the first bitcell programmed by forming a rupture in the dielectric portion of the gate,
 wherein the second doped region is a lightly-doped drain, and a salicide is blocked from forming on the second doped region.

9. The one-time programmable memory device of claim 8, wherein the second doped region is floating.

10. The one-time programmable memory device of claim 8, wherein the second doped region extends across a width of the gate, the second doped region separating the gate from the first doped region.

11. The one-time programmable memory device of claim 8, wherein the first bitcell is read by forward biasing the diode formed by the first doped region and the second doped region.

12. The one-time programmable memory device of claim 8, wherein the first bitcell is programmed by applying a rupture voltage to the second contact, which causes the diode formed by the first doped region and the second doped region to be forward biased.

13. A non-transitory computer-readable storage medium storing a digital representation of a one-time programmable memory device, the one-time programmable memory device comprising a plurality of bitcells arranged in an array comprising rows and columns, a first bitcell of the plurality of bitcells comprising:
 a first doped region implanted in a semiconductor substrate, wherein the first doped region connects the first bitcell to a first subset of the plurality of bitcells in one of the rows of the array;
 a first contact coupled to the first doped region for applying a voltage to the first doped region;
 a second doped region implanted within the first doped region, the first doped region and the second doped region forming a diode; and
 a gate positioned over the second doped region, the gate comprising a dielectric portion capacitively coupled to the second doped region and a conductive portion, the conductive portion coupled to a second contact for applying a voltage to the conductive portion, the voltage applied to the conductive portion independent from the voltage applied to the first doped region, the first bitcell programmed by forming a rupture in the dielectric portion of the gate, wherein the gate connects the first bitcell to a second subset of the plurality of bitcells in one of the columns of the array,
 wherein, in response to reverse biasing the diode formed by the first doped region and the second doped region, the voltage of the second doped region is based on a reverse bias diode leakage and a tunneling current through the dielectric portion of the gate.

14. The non-transitory computer-readable storage medium of claim 13, wherein the second doped region is floating.

15. The non-transitory computer-readable storage medium of claim 13, wherein the second doped region extends across a width of the gate, the second doped region separating the gate from the first doped region.

16. The non-transitory computer-readable storage medium of claim 13, wherein the first bitcell is read by forward biasing the diode formed by the first doped region and the second doped region.

17. The non-transitory computer-readable storage medium of claim 13, wherein the first bitcell is programmed by applying a rupture voltage to the second contact, which causes the diode formed by the first doped region and the second doped region to be forward biased.

18. The non-transitory computer-readable storage medium of claim 13, wherein second doped region is a lightly-doped drain, and a salicide is blocked from forming on the second doped region.

19. The non-transitory computer-readable storage medium of claim 13, wherein the one of the columns is isolated from at least one adjacent column by shallow trench isolation, and the one of the rows is isolated from at least one adjacent row by one of a third doped region and a deep trench.

20. The non-transitory computer-readable storage medium of claim 13, wherein the memory device is fabricated by a bipolar process, a complementary metal-oxide-semiconductor (CMOS) process, or a double-diffused metal-oxide-semiconductor (DMOS) process, and the first doped region is a high voltage well.

* * * * *